US008196068B2

(12) United States Patent
Zhang (10) Patent No.: US 8,196,068 B2
(45) Date of Patent: Jun. 5, 2012

(54) MODELING CRITICAL-DIMENSION (CD) SCANNING-ELECTRON-MICROSCOPY (CD-SEM) CD EXTRACTION

(75) Inventor: Qiaolin Zhang, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 324 days.

(21) Appl. No.: 12/387,383

(22) Filed: Apr. 30, 2009

(65) Prior Publication Data
US 2010/0280812 A1 Nov. 4, 2010

(51) Int. Cl.
G06F 17/50 (2006.01)
G06F 19/00 (2006.01)
G03F 1/00 (2006.01)
G21K 5/00 (2006.01)
G06K 9/00 (2006.01)

(52) U.S. Cl. .............. 716/53; 716/52; 716/54; 716/111; 430/5; 378/35; 382/144; 382/145; 700/98; 700/121

(58) Field of Classification Search .................... 716/52, 716/53, 54, 111; 430/5; 378/35; 382/144, 382/145; 700/98, 121
See application file for complete search history.

(56) References Cited

U.S. PATENT DOCUMENTS

| 6,463,403 | B1 | | 10/2002 | Burdorf | |
|---|---|---|---|---|---|
| 7,065,738 | B1 | | 6/2006 | Kim | |
| 7,566,517 | B1 | * | 7/2009 | Adel et al. | 430/5 |
| 8,001,516 | B2 | * | 8/2011 | Smith et al. | 716/136 |
| 8,065,636 | B2 | * | 11/2011 | Ye et al. | 716/50 |
| 2005/0149902 | A1 | * | 7/2005 | Shi et al. | 716/21 |
| 2005/0240895 | A1 | * | 10/2005 | Smith et al. | 716/19 |
| 2007/0061772 | A1 | * | 3/2007 | Ye et al. | 716/21 |
| 2007/0061773 | A1 | * | 3/2007 | Ye et al. | 716/21 |
| 2007/0186206 | A1 | * | 8/2007 | Abrams et al. | 716/19 |
| 2007/0213967 | A1 | | 9/2007 | Park | |
| 2009/0046920 | A1 | * | 2/2009 | Luk-Pat et al. | 382/144 |
| 2009/0120580 | A1 | * | 5/2009 | Kagoshima et al. | 156/345.24 |
| 2009/0240364 | A1 | * | 9/2009 | Lucas et al. | 700/105 |
| 2009/0300573 | A1 | * | 12/2009 | Cao et al. | 716/19 |
| 2010/0010784 | A1 | * | 1/2010 | Cao et al. | 703/1 |
| 2010/0229147 | A1 | * | 9/2010 | Ye et al. | 716/19 |

* cited by examiner

Primary Examiner — Phallaka Kik
(74) Attorney, Agent, or Firm — Park, Vaughan, Fleming & Dowler LLP; Laxman Sahasrabuddhe (57) ABSTRACT

One embodiment of the present invention relates to a process that models critical-dimension (CD) scanning-electron-microscopy (CD-SEM) extraction during photolithography process model calibration. During operation, the process receives measured CD values which were obtained using a CD-SEM extraction process, wherein the CD-SEM extraction process determines a measured CD value for a feature by measuring multiple CD values of the feature along multiple electron beam scans. The process then determines simulated CD values, wherein a simulated CD value is determined based at least on a set of CD extraction cut-lines evenly placed around the target feature. During subsequent photolithography process model calibration, the process fits a parameter that models an aspect of the photolithography process based at least on both the measured CD values and the simulated CD values.

26 Claims, 11 Drawing Sheets

MODELING CRITICAL-DIMENSION (CD) SCANNING-ELECTRON-MICROSCOPY (CD-SEM) CD EXTRACTION

BACKGROUND

1. Field

The present invention generally relates to semiconductor design and manufacturing. More specifically, the present invention relates to a method and a system for accurately modeling critical-dimension (CD) scanning-electron-microscopy (CD-SEM) CD extraction for use during photolithography process model calibration and post-Optical Proximity Correction (OPC) design layout verification.

2. Related Art

Semiconductor manufacturing technologies typically include a number of processes which involve complex physical and chemical interactions. Since it is almost impossible to find exact formulae to predict the behavior of these complex interactions, developers typically use process models which are fit to empirical data to predict the behavior of these processes. A process model can be used in a number of applications during the design of a semiconductor chip.

For example, in a technique which is referred to as "Optical Proximity Correction" (OPC), a photolithography process model (hereinafter "lithography model") is used to make corrections to a semiconductor chip layout to compensate for undesirable effects of semiconductor manufacturing processes. During an OPC process, an OPC simulation engine uses the lithography model to iteratively evaluate and modify edge segments in the mask layout. The post-OPC mask patterns are expected to produce physical patterns on the wafer that closely match design intent.

Note that the accuracy of the lithography model can limit both the effectiveness of corrected mask patterns and the correctness of post-OPC design layout verification. To generate an accurate lithography model, a fitting process is often performed, which is referred to as "lithography model calibration." One objective of lithography model calibration is to minimize the difference between model-simulated critical dimension (CD) values (or "simulated CDs") and corresponding measured wafer CD values (or "wafer CDs") on test patterns. The particular CD extraction technique used to extract the simulated CDs can have a significant effect on the accuracy of the simulated CDs, and therefore on the accuracy of the OPC model.

Figure 2:
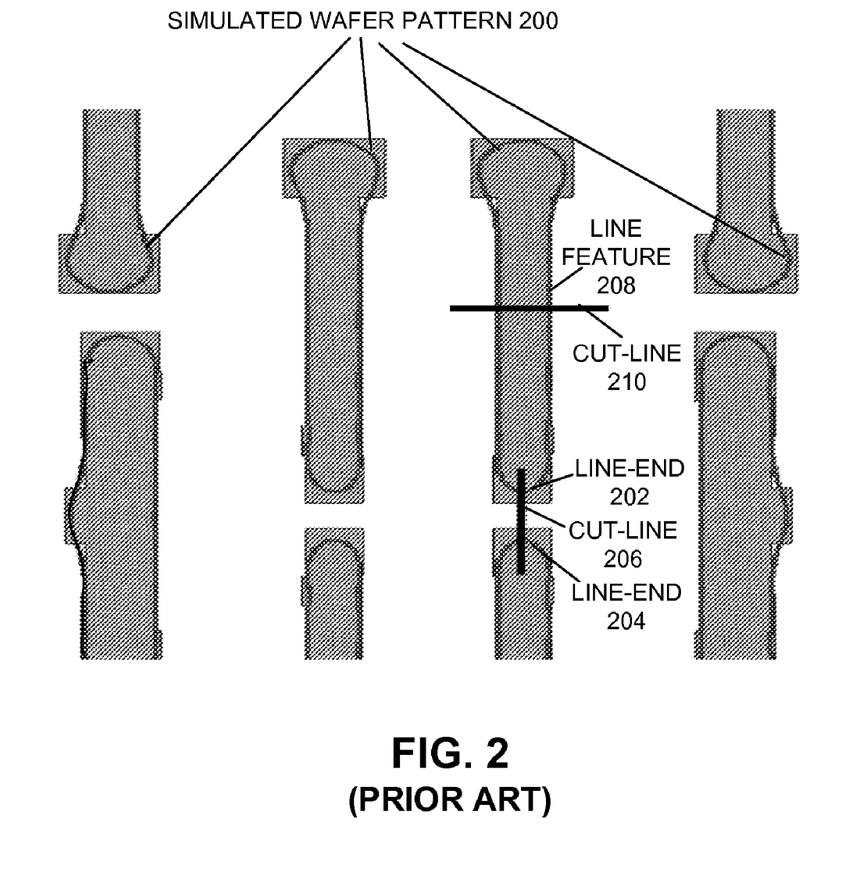
FIG. 2 illustrates a single-cut-line-based CD extraction technique performed on a simulated wafer pattern.

Currently, lithography model calibration tools use a single-cut-line-based CD extraction technique to extract the model-simulated CD values. In this technique, only a single cut-line is placed at a precise location where the CD value is to be extracted. For example, FIG. 2 illustrates a single-cut-line-based CD extraction technique performed on a simulated wafer pattern 200. As illustrated in FIG. 2, the blue geometries represent a part of design layout and the red contours represent simulated wafer pattern 200 of the layout through a lithography process. Note that the simulated CDs are extracted from simulated wafer pattern 200. More specifically, when a CD value needs to be extracted from a target feature within simulated wafer pattern 200, coordinate information is provided for the extraction location. The single-cut-line-based CD extraction technique then places a single cut-line at the precise location on the target feature based on the coordinate information. For example, when a distance between two line-ends 202 and 204 needs to be extracted, a single cut-line 206 is placed right between the very tips of the line-ends 202 and 204. Hence, the extracted CD value using this technique is the shortest distance between simulated line-ends 202 and 204. Similarly, to extract the line-width of line feature 208, single cut-line 210 is placed right at a location on line feature 208 according to the provided coordinate information.

Unfortunately, lithography process models that are created using aforementioned conventional single-cut-line-based CD extraction techniques are not sufficiently accurate. The inaccuracies induced by single-cut-line-based CD extraction technique in the process models are expected to become even more serious as the technology nodes continue to shrink below 45 nm.

SUMMARY

One embodiment of the present invention relates to a process that models critical-dimension (CD) scanning-electron-microscopy (CD-SEM) CD extraction during photolithography process model calibration. During operation, the process receives measured CD values which were obtained using a CD-SEM extraction process, wherein the CD-SEM extraction process determines a measured CD value for a feature by measuring multiple CD values of the feature along multiple electron beam scans on the wafer surface. The process then determines simulated CD values, wherein a simulated CD value is determined based at least on a set of CD extraction cut-lines placed on the test pattern layout. During subsequent photolithography process model calibration, the process fits a parameter that models an aspect of the photolithography process based at least on both the measured CD values and the simulated CD values.

In some embodiments, the process determines the simulated CD value by first placing a measurement window centered at the target feature. The process then places the set of CD extraction cut-lines within the measurement window based at least on a placement spacing parameter, wherein the placement spacing parameter models a spacing between the multiple electron beam scans in the CD-SEM extraction process. Next, the process extracts a set of single-cut-line CD values for the set of CD extraction cut-lines placed on the test pattern layout. The process next determines the simulated CD value using the set of single-cut-line CD values.

In some embodiments, the fitting parameter includes the placement spacing parameter.

In some embodiments, prior to placing the measurement window, the process obtains the simulated pattern by convolving the feature with a photolithography process model.

In some embodiments, the process determines the simulated CD value using the set of single-cut-line CD values by computing an average of the set of single-cut-line CD values.

In some embodiments, the process fits the parameter by, iteratively: updating the simulated CD values based at least on an updated photolithography process model, and updating the parameter's value based at least on a difference between the updated simulated CD values and the measured CD values.

In some embodiments, the process fits the parameter by minimizing a difference between the simulated CD values and the measured CD values.

One embodiment of the present invention relates to another process that models critical-dimension (CD) scanning-electron-microscopy (CD-SEM) extraction during photolithography process model calibration. During operation, the process receives a simulated CD value for a feature, wherein the simulated CD value is extracted from a simulated pattern associated with the feature using a single cut-line placed on the desired feature on a test pattern layout. The process also receives raw CD-SEM measurement data for the feature, wherein the raw CD-SEM measurement data includes multiple measured CD values extracted for the feature using multiple electron beam scans distributed within a measurement window centered at the feature. The process then uses the multiple measured CD values to determine a predicted CD value which predicts the simulated CD value. Next, the process calibrates the photolithography process model based at least on both the predicted CD value and the simulated CD value.

In some embodiments, the process determines the predicted CD value by determining a CD value along a cut-line on the feature on the wafer, wherein the location of the cut-line matches the location of the single cut-line used to extract the simulated CD value.

In some embodiments, the process determines the CD value along the cut-line whose location matches the location of the single cut-line on the test pattern layout by performing a curve fitting on the multiple measured CD values to determine a local minimum or maximum value.

One embodiment of the present invention relates to a process that models critical-dimension (CD) scanning-electron-microscopy (CD-SEM) extraction during post-optical-proximity-correction (post-OPC) design layout verification. During operation, the process receives measured CD values which were obtained using a CD-SEM extraction process from wafer, wherein the CD-SEM extraction process determines a measured CD value for a feature by measuring multiple CD values of the feature along multiple electron beam scans on the wafer surface. The process then determines simulated CD values, wherein a simulated CD value is determined based at least on a set of CD extraction cut-lines placed on the target feature on test patter layout. During subsequent post-OPC verification, the process verifies the quality of design layout corrected by OPC by comparing the measured CD values with the simulated CD values.

In some embodiments, this process determines the simulated CD value by first placing a measurement window centered at the feature. The process then places the set of CD extraction cut-lines within the measurement window based at least on a placement spacing parameter, wherein the placement spacing parameter models a spacing between the multiple electron beam scans on the wafer surface in the CD-SEM extraction process. Next, the process extracts a set of single-cut-line CD values for the set of CD extraction cut-lines on the test patter layout. The process next determines the simulated CD value using the set of single-cut-line CD values.

One embodiment of the present invention relates to another process that models critical-dimension (CD) scanning-electron-microscopy (CD-SEM) extraction during post-optical-proximity-correction (post-OPC) design layout verification. During operation, the process receives a simulated CD value for a feature, wherein the simulated CD value is extracted from the target feature using a single cut-line placed on the test pattern layout. The process also receives raw CD-SEM measurement data for the feature, wherein the raw CD-SEM measurement data includes multiple measured CD values extracted for the feature using multiple electron beam scans. The process then uses the multiple measured CD values to determine a predicted CD value which predicts the simulated CD value. During subsequent post-OPC verification, the process verifies the quality of design layout corrected by OPC by comparing the predicted CD value with the simulated CD value.

In some embodiments, the process determines the predicted CD value by determining a CD value along a cut-line on the target feature, wherein the location of the cut-line matches the location of the single cut-line used to extract the simulated CD value.

In some embodiments, the process determines the CD value along the cut-line whose location matches the location of the single cut-line by performing a curve fitting on the multiple measured CD values to determine a local minimum or maximum value.

BRIEF DESCRIPTION OF THE FIGURES

The patent or application file contains at least one drawing executed in color. Copies of this patent or patent application publication with color drawing(s) will be provided by the Office upon request and payment of the necessary fee.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit Design Flow

Figure 1:
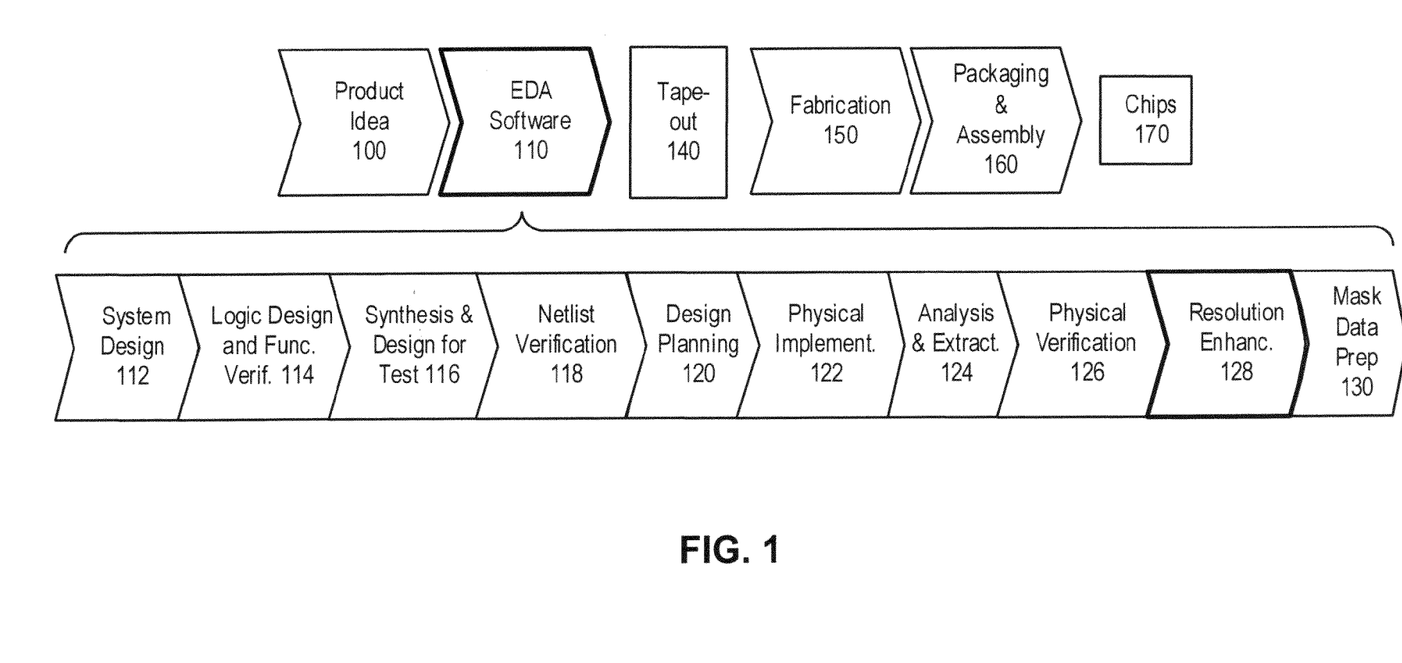
FIG. 1 illustrates various steps in the design and fabrication of an integrated circuit in accordance with an embodiment of the present invention.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, HSPICE®, HSIM®, NANOTIME®, NANOSIM® and STAR-RCXT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS® AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the resolution enhancement step 128.

OPC Process Flow

Figure 3:
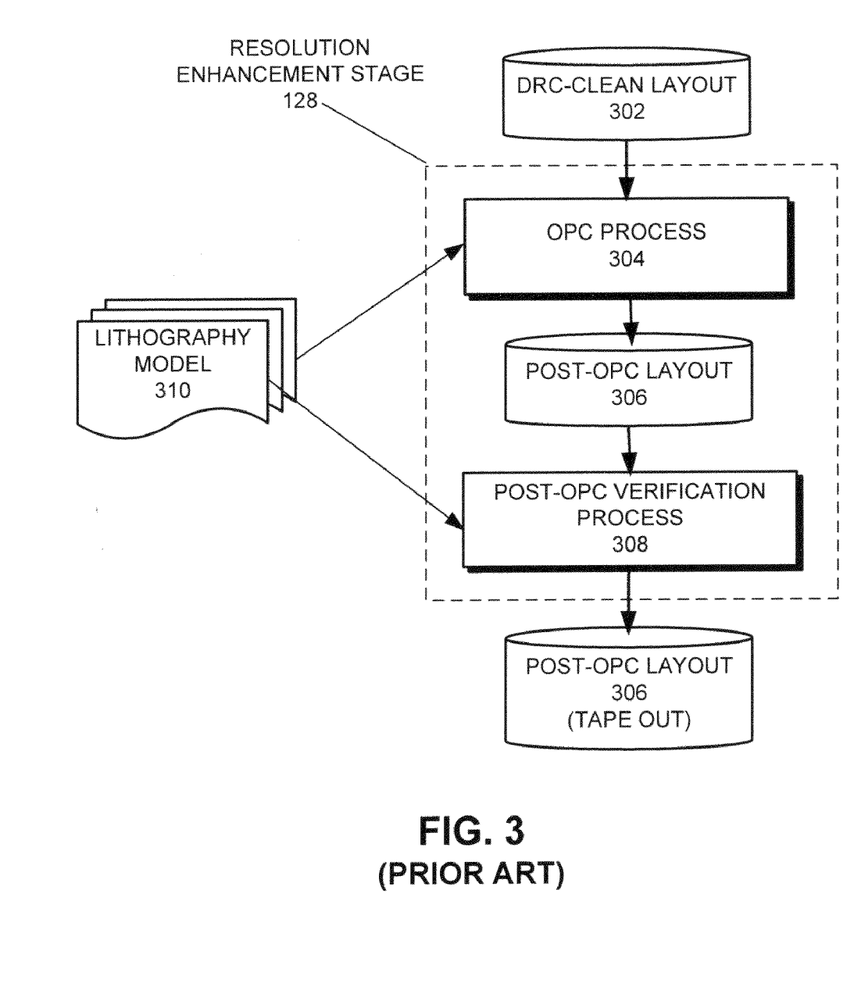
FIG. 3 illustrates a detailed process flow diagram of resolution enhancement stage 128 in FIG. 1.

FIG. 3 illustrates a detailed process flow diagram of resolution enhancement stage 128 in FIG. 1. Prior to performing resolution enhancement, a DRC-clean layout 302 is generated at physical verification stage 126 in FIG. 1. DRC-clean layout 302 is the input to resolution enhancement stage 128, which further includes an optical proximity correction (OPC) process 304 and a post-OPC verification process 308. OPC process 304 can further include a number of mask manipulation tools, which can include, but are not limited to, line biasing, assist feature placement, and phase-shifting mask. The output of OPC process 304 is a referred to as a "post-OPC" layout 306 because it is an OPC-corrected, DRC-clean layout.

Next, post-OPC layout 306 is re-examined during post-OPC verification process 308 to ensure that post-OPC layout 306 meets the lithography constraints. If the post-OPC verification process is successful, post-OPC layout 308 is then ready for tape-out. However, if the post-OPC verification fails, tape-out is aborted and remedial actions have to be taken.

Note that both OPC process 304 and post-OPC verification process 306 require using a photolithography process model (hereinafter "lithography model") 310 to simulate printed design patterns on the wafer. Note that lithography model 310 includes a set of mathematical models that describe the photolithography process. In some embodiments, these mathematical models are represented by a set of predetermined kernel functions. These kernel functions are typically calibrated using both the measured wafer CDs and simulated CDs from test patterns, as mentioned previously. We describe the process of lithography model calibration in more detail below.

Lithography Model Calibration

Figure 4:
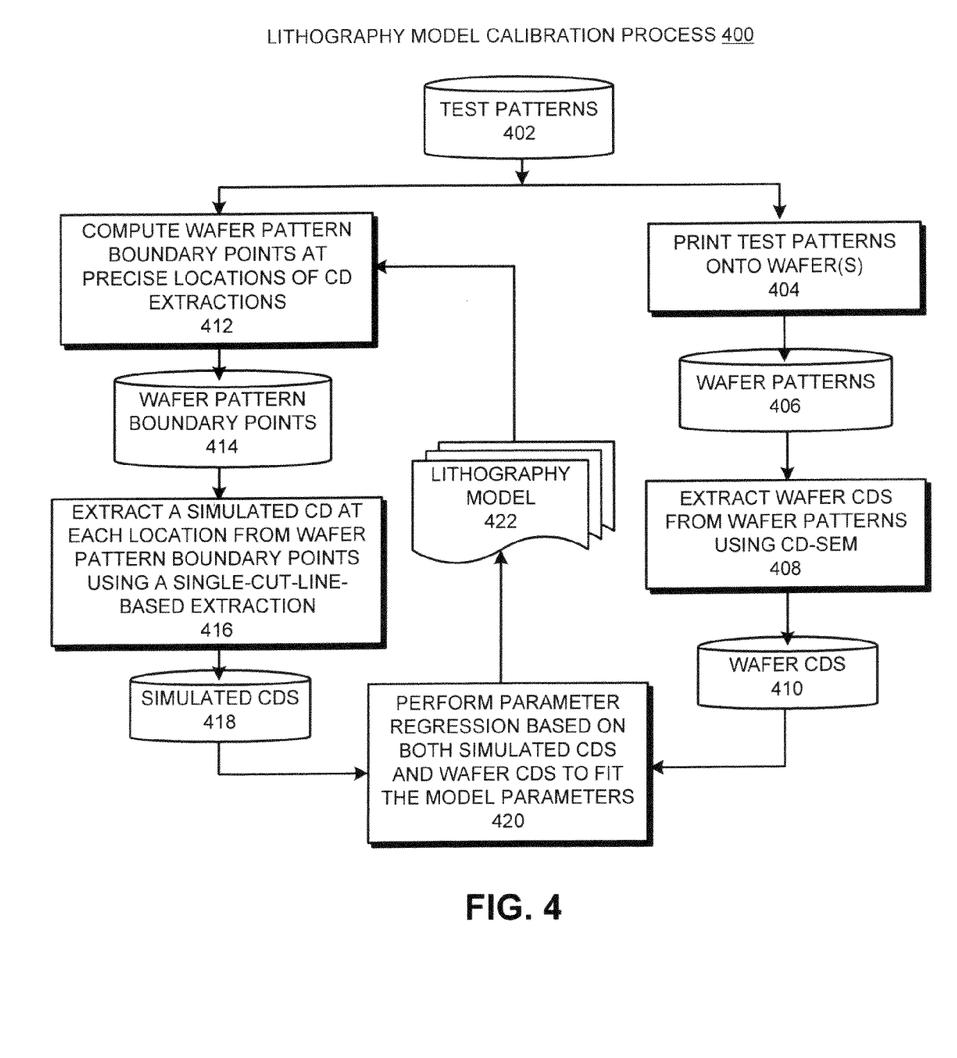
FIG. 4 illustrates a process flow diagram of a conventional lithography model calibration process.

FIG. 4 illustrates a process flow diagram of a conventional lithography model calibration process 400. As illustrated in FIG. 4, lithography model calibration process 400 starts by receiving a set of test patterns 402. Typically, these test patterns 402 are configured to represent various design patterns permitted by design rules in actual layouts. Test patterns 402 are then printed onto one or more wafers through a physical photolithograph system (step 404), which transfers test patterns 402 into wafer patterns 406. Next, a critical-dimension scanning-electron-microscopy (CD-SEM) measurement process is used to extract wafer CDs from wafer patterns 406 using a measurement-window-based extraction technique (step 408).

More specifically, before calibration process 400, the CD-SEM measurement tool extracts wafer CDs at a set of designated locations within test patterns 402 based on provided coordinate information. We refer to a layout feature in a test pattern at a given CD extraction location as a "target feature" hereinafter. For each target feature where a single CD value is to be extracted, the CD-SEM measurement tool then places a measurement window around the target feature. Within this measurement window, the CD-SEM measurement tool then performs multiple electron beam scans along a specified direction, and subsequently measures a CD value for each scan within the measurement window.

Figure 5A:
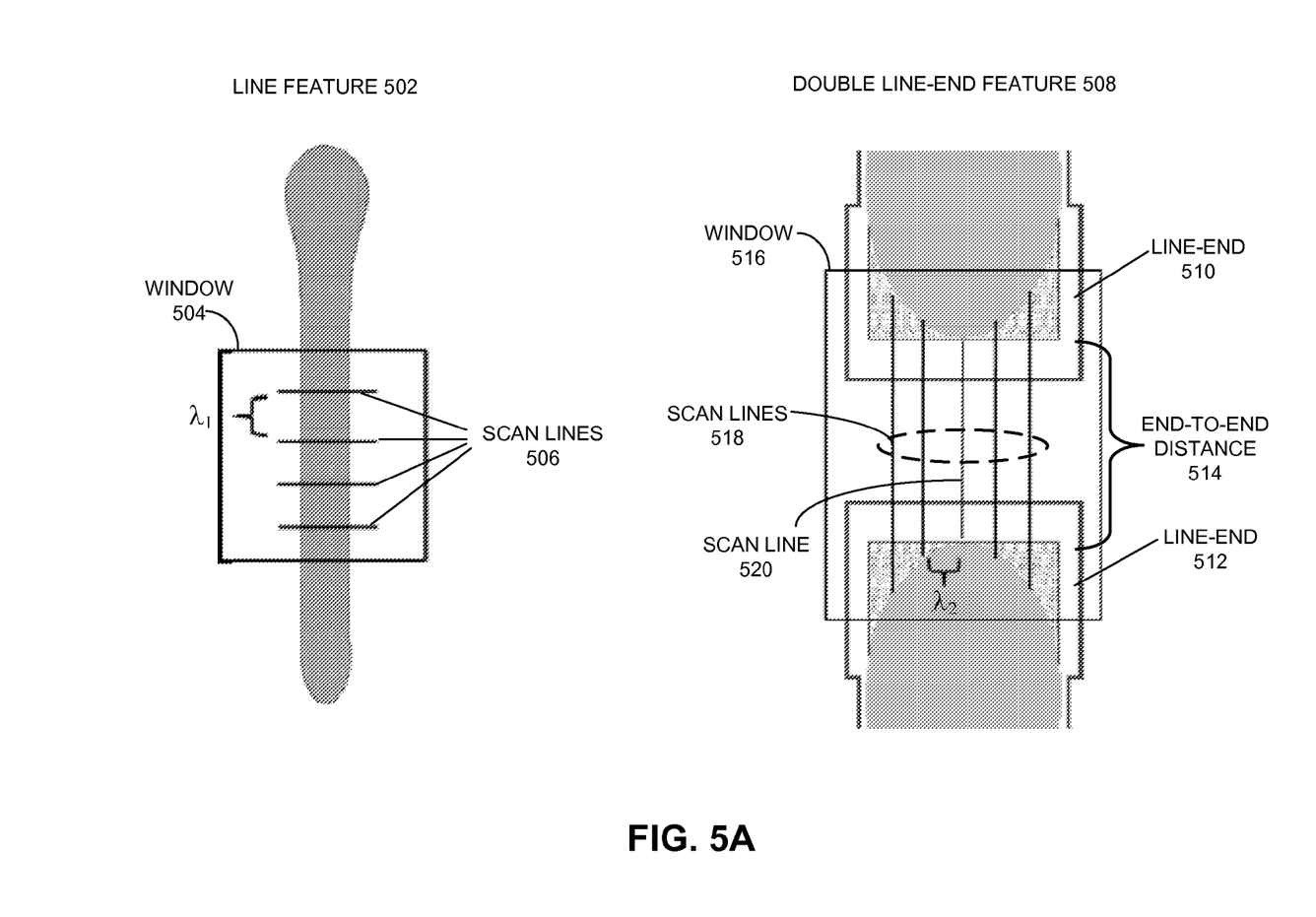
FIG. 5A illustrates examples of the measurement-window-based extraction technique used by the CD-SEM extraction process to extract wafer CDs from the wafer patterns.

FIG. 5A illustrates examples of the measurement-window-based measurement technique used by the CD-SEM measurement tool to measure wafer CDs from wafer patterns 406. More specifically, FIG. 5A illustrates two types of target features associated with two wafer CDs. The first target feature in FIG. 5A is a line feature 502 (shown on the left) wherein a CD value representing the width of line feature 502 is to be extracted. As seen in FIG. 5A, a measurement window 504 is placed around the middle section of line feature 502 by the CD-SEM measurement tool and a set of parallel scan lines 506 are shown within window 504 to represent multiple CD-SEM electron beam scans. In this example, each extracted wafer CD value measures the distance between the two intersection points between a corresponding scan line and the boundary of line feature 502. Also note that in this example, the set of scan lines 506 are equally spaced with a placement distance of $\lambda_1$.

The second target feature in FIG. 5A is a double-line-end feature 508 (shown on the right) which comprises line-end 510, line-end 512, and an end-to-end distance 514 between the two line-ends, wherein a CD value representing end-to-end distance 514 is to be extracted. More specifically, the red outlines in FIG. 5A represent the shape of line-ends 510 and 512 in the original layout, whereas the green curvatures represent the shape of the line-ends when they are printed on the wafer. As seen in FIG. 5A, a measurement window 516 is placed around line-end feature 508 by the CD-SEM measurement tool to enclose portions of the two line-ends and the gap between them. A set of parallel scan lines 518 are shown within window 516 to represent the multiple CD-SEM electron beam scans. In this example, each extracted wafer CD value measures the distance between two intersection points between a corresponding scan lines and the boundaries of line-ends 510 and 512. Note that the set of scan lines 518 may not include a measurement placed precisely at the shortest distance between the two line-ends. Furthermore, the set of scan lines 518 are equally spaced with a placement distance of $\lambda_2$. Note that $\lambda_1$ and $\lambda_2$ have different values in these two examples. Sometimes, line feature 502 is referred to as a one-dimensional (1D) feature, whereas the double line-end feature 508 is referred to as a two-dimensional (2D) feature.

After extracting multiple wafer CDs from a measurement window associated with each target feature, the CD-SEM measurement tool computes the average of the set of wafer CDs and reports the average CD as the extracted wafer CD for the target feature. Referring back to FIG. 4, the wafer-CD-extraction step 408 output a set of wafer CDs 410, wherein each wafer CD 410 represents an averaged CD obtained based on the measurement-window-based technique. Note that this measurement-window-based CD extraction technique is often used to compensate for the effect of stage misalignment in CD-SEM measurements, wherein using a single CD-SEM scan can result in large errors from measurement to measurement even on the same feature. Hence, when multiple scans are used at each target feature, the stage misalignment effect is minimized and the measurements generate consistent results from measurement to measurement.

For each measured wafer CD described above, lithography model calibration process 400 also obtains a corresponding simulated CD. More specifically, based on the coordinate information, target features at the precise locations of CD extractions are convolved with a lithography model 422 being calibrated to obtain simulated wafer pattern boundary points 414 at the extraction locations (step 412). Note that lithography model 422 can be an initial lithography model at the beginning of the model calibration process, or an intermediate lithography model during the course of the model calibration process. Typically, lithography model 422 includes a set of model parameters which are being regressed during model calibration.

Next, lithography model calibration process 400 uses a single-cut-line-based extraction technique (as described in FIG. 2) to obtain a simulated CD at each extraction location based on the simulated wafer pattern boundary points 414 (step 416). Hence, calibration process 400 obtains a set of simulated CDs 418 corresponding to the set of wafer CDs 410 within test patterns 402.

Both wafer CDs 410 and simulated CDs 418 are then used together in a model parameters regression (i.e., tuning and searching) process, to fit the set of model parameters (step 420), thereby updating lithography model 422. In one embodiment, the fitting process is performed to minimize the differences between the set of simulated CDs and the set of wafer CDs. Note that lithography model calibration process 400 is performed iteratively wherein lithography model 422 is iteratively updated.

However, this single-cut-line-based CD extraction technique is a simplified model which is inconsistent with the physical CD-SEM measurement tool in CD-SEM. Therefore, the regression analysis during model calibration process can drive one or more model parameters into having non-physical values to compensate for the discrepancies, thus degrading model stability and accuracy.

Modified (Measurement-Window-Based) Lithography Model Calibration

Embodiments of the present invention provide a measurement-window-based simulated CD extraction technique. Because this technique is a modification to the conventional single-cut-line-based simulated CD extraction technique described in FIG. 4, we refer to the measurement-window-based technique as "modified" simulated CD extraction, and to the simulated CD extracted using the technique as a "modified" simulated CD. Furthermore, we refer to a lithography model calibration process using this modified simulated CD extraction as a "modified" lithography model calibration process.

Figure 5B:
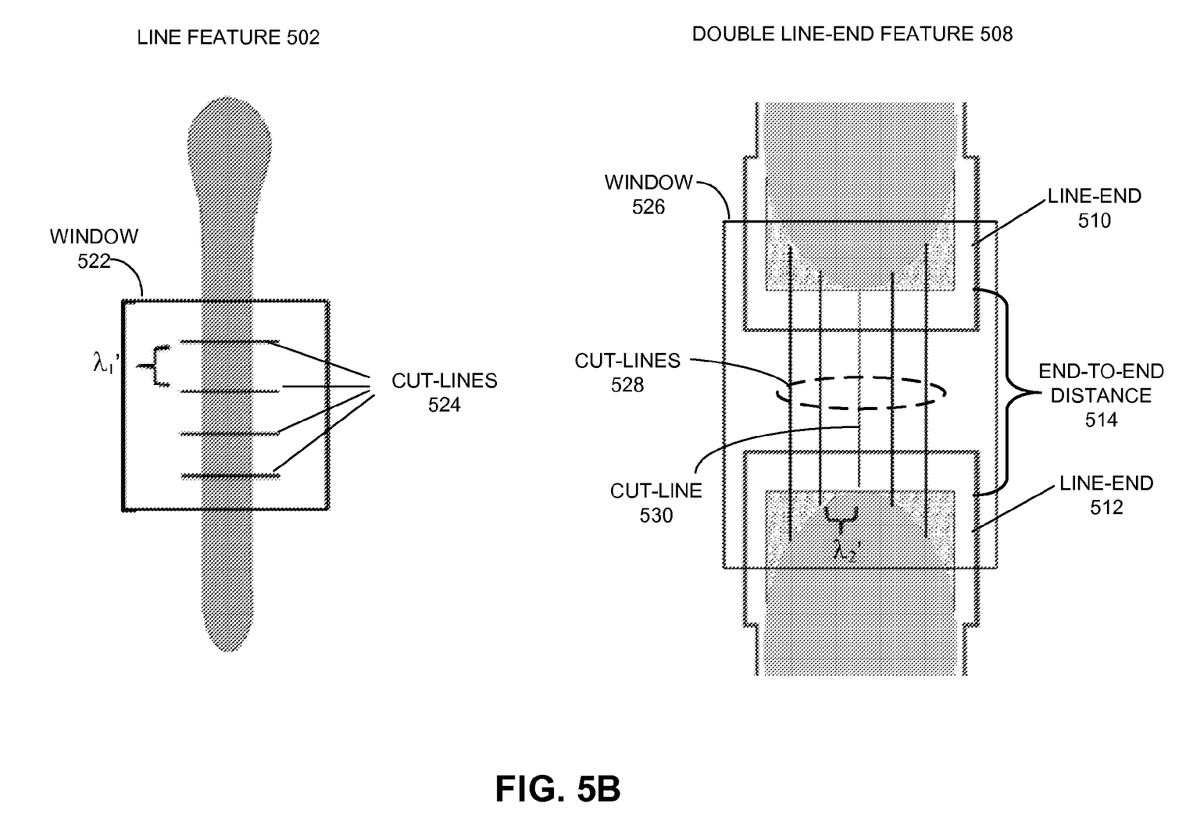
FIG. 5B illustrates examples of a measurement-window-based simulated CD extraction technique on target features in accordance with an embodiment of the present invention.

FIG. 5B illustrates examples of a measurement-window-based simulated CD extraction technique on target features in accordance with an embodiment of the present invention. More specifically, FIG. 5B illustrates the same two target features in FIG. 5A. As seen in FIG. 5B, a measurement window 522 is placed around the middle section of line feature 502 by the measurement-window-based simulated CD extraction tool and a set of parallel cut-lines 524 are shown within window 522 to represent multiple CD extraction locations. Note that in this example, the set of cut-lines 524 are equally spaced with a placement distance of $\lambda_1'$, wherein $\lambda_1'$ can the same or different from $\lambda_1$ in FIG. 5A.

The second target feature in FIG. 5B is double-line-end feature 508 which comprises line-end 510, line-end 512, and an end-to-end distance 514 between the two line-ends, wherein a CD value representing end-to-end distance 514 is to be extracted. As seen in FIG. 5B, a measurement window 526 is placed around line-end feature 508 by the measurement-window-based simulated CD extraction tool to enclose portions of the two line-ends and the gap between them. A set of parallel cut-lines 528 are shown within window 526 to represent the multiple CD extraction locations. Note that the shortest cut-line 530 within cut-lines 528 may not be placed precisely at the shortest distance between the two line-ends. Furthermore, the set of cut-lines 528 are equally spaced with a placement distance of $\lambda_2'$, wherein $\lambda_2'$ can the same or different from $\lambda_2$ in FIG. 5A.

Figure 6:
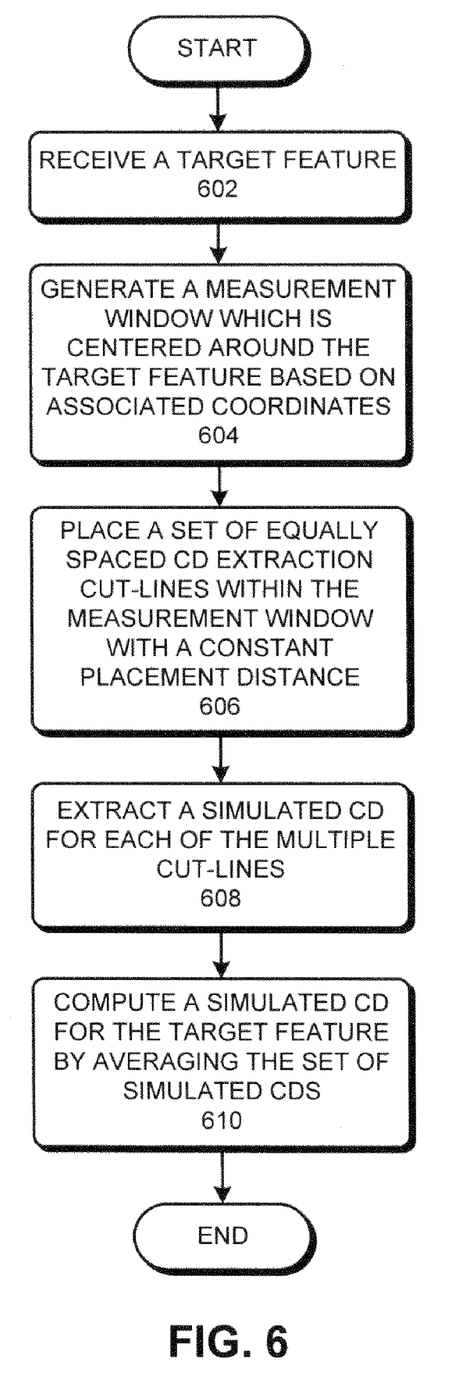
FIG. 6 presents a flowchart illustrating a process of performing a simulated CD extraction on a target feature in accordance with an embodiment of the present invention.

FIG. 6 presents a flowchart illustrating a process of performing a measurement-window-based simulated CD extraction on a target feature in accordance with an embodiment of the present invention. During operation, the system receives a target feature (step 602).

Next, the system generates a measurement window which is centered around the target feature on the test pattern design layout based on the associated coordinate information (step 604). In some embodiments, the measurement window size is adaptively determined according to the target feature size and patterns surrounding the target feature. For example, to generate a window for line-end feature 508, the height of the window may be chosen to include the entire line-ends (i.e., to where the curvature change stops), while the width of the window may be chosen to include the widest part of the line ends. In other embodiments, a fixed window size is used. In another embodiment, the minimum window size is determined to allow placing at least two cut-lines.

The system then places a set of equally spaced CD extraction cut-lines within the measurement window with a constant placement distance to mimic the CD-SEM measurement scheme (step 606). Note that if the system can receive information on the placement distance used by CD-SEM to measure the wafer CD on the same target pattern, the same placement distance can be used for the simulated CD extraction. However, the system may not have this information available. Hence, one embodiment of the present invention treats the placement distance as a model parameter. Typically, the system can assign an initial value to the placement distance. This initial value can be a nominal value which is commonly used in CD-SEM. As is described in more detail below, this placement distance parameter is allowed to vary during the subsequent model calibration process. In some embodiments, the system assigns lower and upper limits to the placement distance parameter so that during calibration the parameter is not allowed to vary too far from the nominal value. Note that even if the system has the information of the actual placement distance used by CD-SEM, the system can still choose to designate the placement distance as a model parameter instead of fixing it to the actual value.

Upon assigning the measurement window and the multiple cut-lines, the system extracts a simulated CD for each of the multiple cut-lines (step 608). After extracting a set simulated CDs associated with the set of cut-lines, the system computes a simulated CD for the target feature by averaging the set of simulated CDs (step 610). Note that this averaging operation mimics the averaging operation performed by CD-SEM to obtain the wafer CDs.

While FIG. 6 describes the process of extracting a single simulated CD value on a given test pattern design layout, the process is used to extract simulated CDs from the set of test patterns involved in lithography model calibration. Note that for different types of test patterns, CD-SEM may use different placement distances during the measurement. In one embodiment, CD-SEM uses two distinctive placement distances: a first one for line patterns, and a second for other patterns. Accordingly, the modified model calibration process generates two corresponding fitting parameters, $\lambda_1$ (for line features or 1D features) and $\lambda_2$ (for other features or 2D features).

Figure 7:
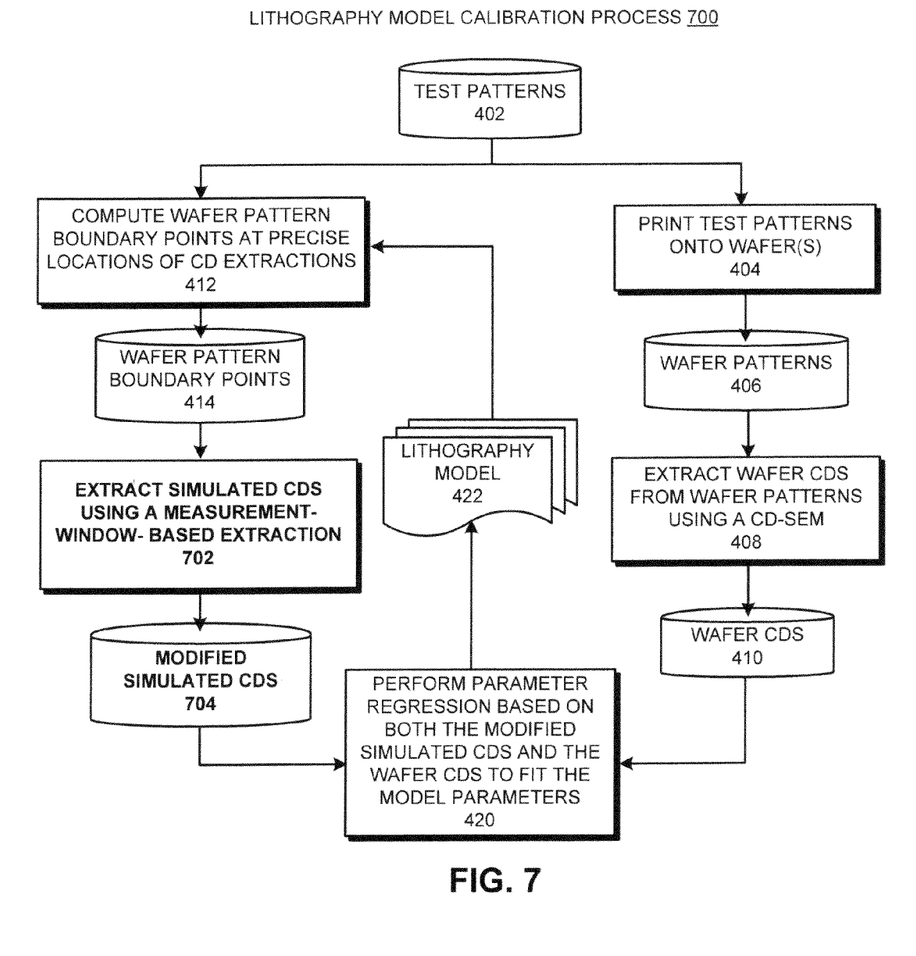
FIG. 7 illustrates a modified lithography model calibration process which uses the measurement-window-based simulated CD extraction in accordance with an embodiment of the present invention.

FIG. 7 illustrates a modified lithography model calibration process 700 which uses the measurement-window-based simulated CD extraction in accordance with an embodiment of the present invention. Note that lithography model calibration process 700 is similar to lithography model calibration process 400 described in FIG. 4. However in modified process 700, a measurement-window-based simulated CD extraction step 702 as is described in FIG. 6, replaces the single-cut-line-based simulated CD extraction step 416. Moreover, modified (i.e., window-based) simulated CDs 704 replace single-cut-line-based simulated CDs 418 in FIG. 4. Similar to the calibration process in FIG. 4, modified simulated CDs 704 and wafer CDs 410 are then used together in a regression process to fit a set of lithography model parameters. In one embodiment, the set of lithography model parameters include the placement distance parameters, such as $\lambda_1$ and $\lambda_2$. Note that during the regression, $\lambda_1$ and $\lambda_2$ can be regressed together with other lithography model parameters. Alternatively, $\lambda_1$ and $\lambda_2$ can be calibrated independently.

In one embodiment, the modified model calibration process is performed in an iterative manner to minimize the differences between the set of modified simulated CDs 704 and the set of wafer CDs 410. During each iteration of the calibration, simulated wafer pattern boundary points 414 are recomputed and the modified simulated CDs 704 are subsequently extracted. Note that when the lithography model calibration is completed, the placement distance parameters should substantially match the actual placement distances used in the CD-SEM measurement.

Modified (Single-Cut-Line-Based) Lithography Model Calibration

As illustrated in FIG. 2, the conventional simulated CD extraction technique can precisely place a single cut-line at a desired location on a target feature. In one embodiment, this single cut-line can be precisely placed such that the extracted simulated CD is substantially equal to a minimum or maximum possible value. For example, in the case of double line-end feature 508, a single cut-line for extraction of a simulated CD can be placed between the very tips of two line-ends 510 and 512.

In contract, although CD-SEM performs multiple measurements for each target feature within a measurement window, there is no guarantee that one of these scan lines coincides with the single cut-line of the simulated CD due to inherent stage misalignments. For example in FIG. 5, scan line 520 which is associated with the smallest CD value among scan lines 518 typically does not coincide with the minimum CD (i.e., tip-to-tip) cut-line in feature 508. However, if the raw CD-SEM measurement data on a target feature can be obtained, a data analysis can be performed on the raw CD-SEM data to determine a minimum or maximum CD value. Hence, the single-cut-line-based simulated CD value can be predicted based on the multiple measured CD values on the target feature.

Figure 8:
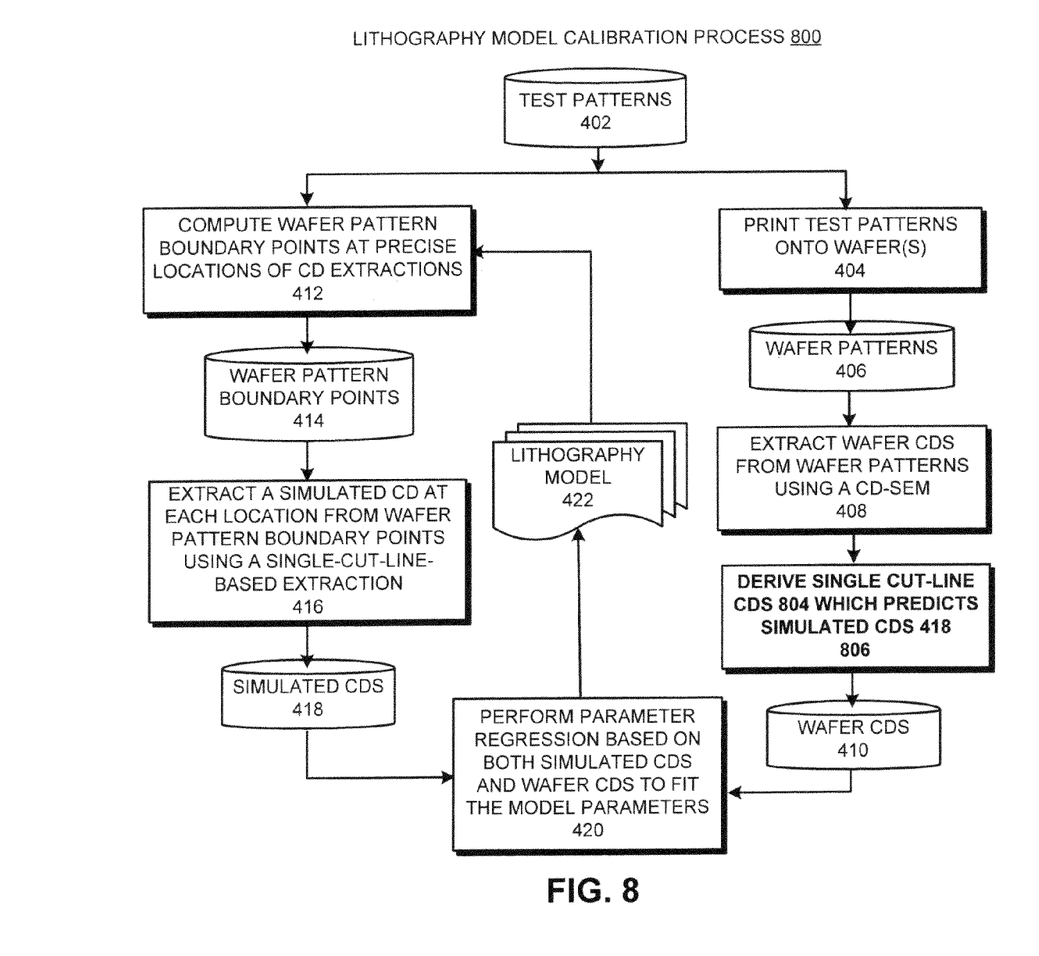
FIG. 8 illustrates a modified lithography model calibration process which uses a wafer CD derived from raw CD-SEM measurement data in accordance with an embodiment of the present invention.

FIG. 8 illustrates a modified lithography model calibration process 800 which uses a wafer CD derived from raw CD-SEM measurement data in accordance with an embodiment of the present invention. Note that lithography model calibration process 800 is similar to lithography model calibration process 400 described in FIG. 4. In particular, model calibration process 800 uses the conventional single-cut-line CD extraction technique to obtain the simulated CDs 418. Furthermore, CD-SEM is used to obtain multiple CD measurements for each target feature based on multiple electron beam scans within a measurement window. However in process 800, the averaged CD of the multiple measured CDs is not used as wafer CDs 410 for lithography model calibration as in processes 400 and 700. Instead, the multiple measured CDs for each target feature are processed to derive single-cut-line CDs 804, which predicts single-cut-line CDs 418 obtained using the conventional single-cut-line CD extraction technique (step 806). In some embodiments, a derived single-cut-line CD 804 represents a minimum or maximum CD value within the corresponding measurement window. For example, in the case of double line-end feature 508, a derived single-cut-line CD 804 is the tip-to-tip distance between two line-ends 510 and 512.

In order to derive single-cut-line CDs 804, the original CD-SEM measurement data is required, which can be in either image format or CD data format. In one embodiment, if the CD-SEM measurement data is in CD data format, a curve-fitting technique can be used to derive a minimum or maximum CD value within the measurement window and then use the minimum or maximum CD as single-cut-line CD 804. In another embodiment, if the CD-SEM measurement data is received in image format, an image-processing technique can be used to derive the wafer CD exactly at the desired location as single-cut-line CD 804. As described above, the derived minimum or maximum CD value is not necessarily the smallest or the largest CD value in the original CD-SEM measurement data.

Note that the technique used in model calibration process 800 allows wafer CDs 410 to physically match how simulated CDs 418 are generated. Also, this technique does not add extra model fitting parameters (i.e., the placement distances) into the model fitting process, and hence simplifies the regression computation in model calibration. However, this technique relies on the availability of the raw CD-SEM measurement data.

Modified Post-OPC Verification

Similar to model calibration processes 400, 700, and 800, during post-OPC verification process 308 of resolution enhancement stage 128, model simulated CDs and measured wafer CDs on a given layout are separately generated. However, rather than using these CDs to drive a model calibration process, the differences between them are compared with verification criteria to determine the quality of the design layout after OPC.

Figure 9:
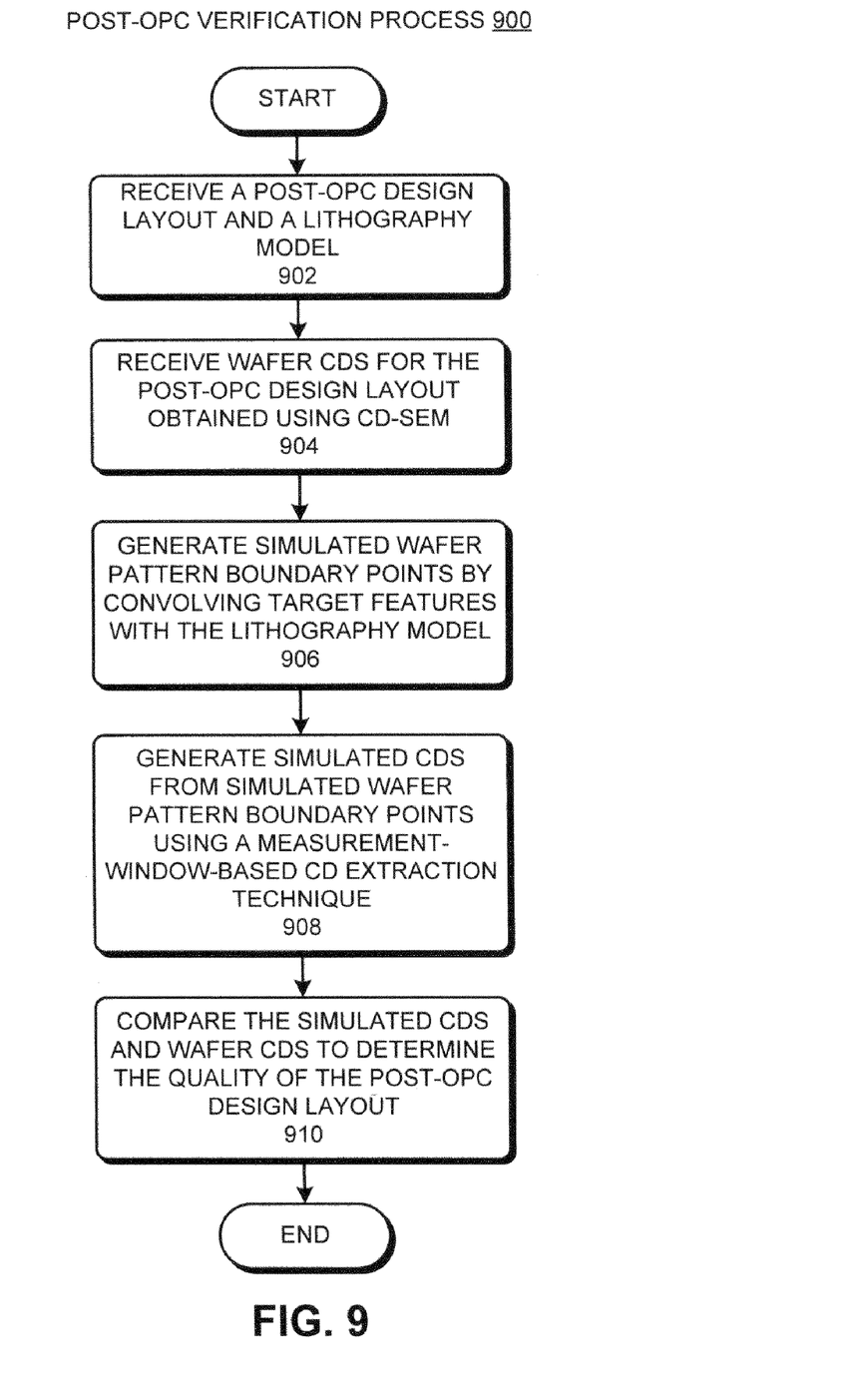
FIG. 9 presents a flowchart illustrating a modified post-OPC verification process which uses the measurement-window-based simulated CD extraction in accordance with an embodiment of the present invention.

FIG. 9 presents a flowchart illustrating a modified post-OPC verification process 900 which uses the measurement-window-based simulated CD extraction in accordance with an embodiment of the present invention.

During operation, the system receives a post-OPC design layout and a lithography model (step 902). Note that the lithography model has a set of fixed fitting parameters. In one embodiment, the set of fixed parameters include placement distance parameters $\lambda_1$ and $\lambda_2$ associated with the measurement-window-based simulated CD extraction technique described above. In this embodiment, the received lithography model has been calibrated at least partially based on calibration process 700. The system also receives wafer CDs for the post-OPC design layout which are obtained using CD-SEM (step 904). Note that these wafer CDs are obtained conventionally as is described in FIG. 4.

The system then generates simulated wafer pattern boundary points at CD extraction locations by convolving target features of the post-OPC layout at these locations with the lithography model (step 906). Next, the system generates the simulated CDs from the simulated wafer pattern boundary points using a measurement-window-based CD extraction technique (step 908). The detailed process of step 908 is substantially similar to the process described in FIG. 6, and hence is not repeated here. Note that step 908 modifies the conventional post-OPC verification process which generates the simulated CDs based on the single-cut-line extraction technique. Finally, the system compares the simulated CDs and wafer CDs to determine the quality of the post-OPC design layout (step 910).

Figure 10:
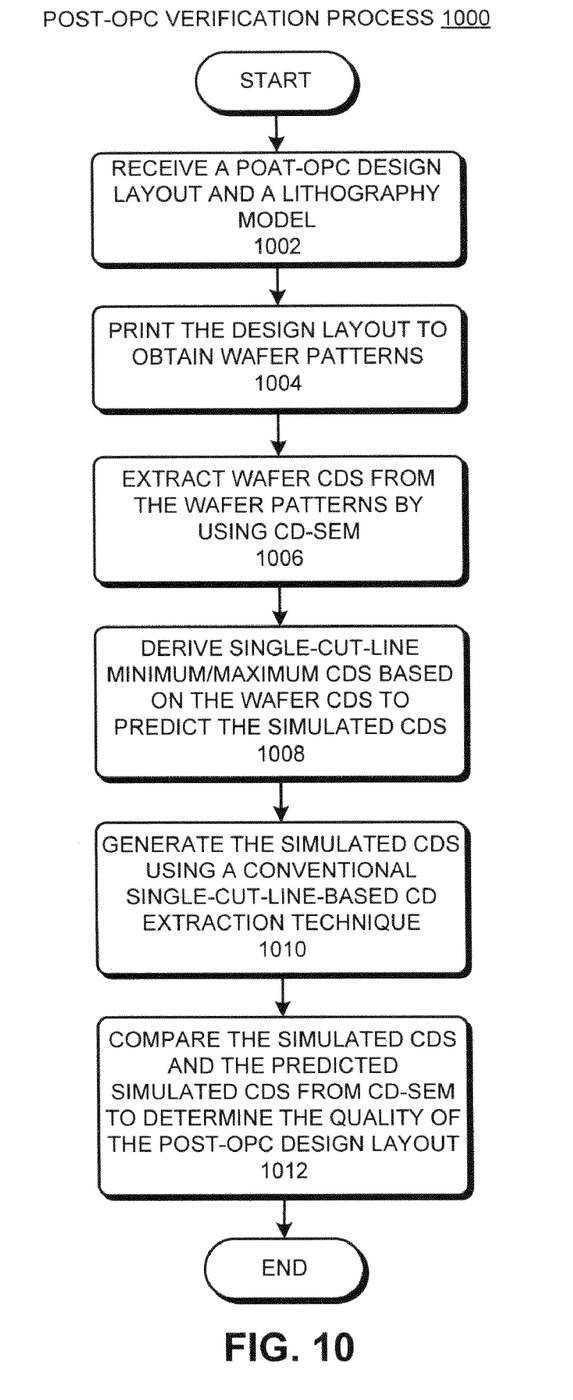
FIG. 10 presents a flowchart illustrating a modified post-OPC verification process which uses the modified wafer CD extraction technique in accordance with an embodiment of the present invention.

FIG. 10 presents a flowchart illustrating a modified post-OPC verification process 1000 which uses the modified wafer CD extraction technique in accordance with an embodiment of the present invention.

During operation, the system receives a post-OPC design layout and a lithography model (step 1002). Note that the lithography model has a set of fixed fitting parameters. However, the set of fixed fitting parameters do not include the placement distance parameters associated with the measurement-window-based simulated CD extraction technique described above. In this embodiment, the lithography model can be calibrated using conventional model calibration techniques.

The system then prints the post-OPC design layout to obtain wafer patterns (step 1004) and subsequently extracts wafer CDs from the wafer patterns by using CD-SEM (step 1006). Note that this step is conventional as is described in FIG. 4. Next, the system derives single-cut-line minimum or maximum CDs based on the wafer CDs to predict simulated CDs which are extracted using the conventional single-cut-line-based CD extraction technique (step 1008). Note that step 1008 modifies the conventional post-OPC verification process which generates averaged wafer CDs based on the multiple electron beam scans in a measurement window.

The system also generates the simulated CDs using a conventional single-cut-line-based CD extraction technique (step 1010). Finally, the system compares the simulated CDs and the predicted simulated CDs from CD-SEM to determine the quality of the post-OPC design layout (step 1012).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for modeling critical-dimension (CD) scanning-electron-microscopy (CD-SEM) extraction during photolithography process model calibration, the method comprising:
receiving a measured CD value which was obtained using a CD-SEM extraction process, wherein the CD-SEM extraction process determines the measured CD value for a feature by measuring multiple CD values of the feature along multiple electron beam scans;
determining a simulated CD value for the feature, wherein the simulated CD value is determined based at least on a set of CD extraction cut-lines which are substantially parallel to each other and are used to compute a single CD value for the feature; and
during photolithography process model calibration, fitting, by computer, a parameter that models an aspect of a photolithography process based at least on both the measured CD value and the simulated CD value.

2. The method of claim 1, wherein determining the simulated CD value involves:
placing a measurement window to enclose a target feature;
placing the set of CD extraction cut-lines within the measurement window based at least on a placement spacing parameter, wherein the placement spacing parameter models a spacing between the multiple electron beam scans in the CD-SEM extraction process;
extracting a set of single-cut-line CD values for the set of CD extraction cut-lines; and
determining the simulated CD value using the set of single-cut-line CD values.

3. The method of claim 2, wherein the fitting parameter includes the placement spacing parameter.

4. The method of claim 2, wherein prior to placing the measurement window, the method further comprises obtaining the simulated pattern by convolving the feature with a photolithography process model.

5. The method of claim 1, wherein determining the simulated CD value using the set of single-cut-line CD values involves computing an average of the set of single-cut-line CD values.

6. The method of claim 1, wherein fitting the parameter involves, iteratively:
updating the simulated CD value based at least on an updated photolithography process model; and
updating the parameter's value based at least on a difference between the updated simulated CD value and the measured CD value.

7. The method of claim 1, wherein fitting the parameter involves minimizing a difference between the simulated CD value and the measured CD value.

8. A non-transitory computer-readable storage medium storing instructions that when executed by a computer cause the computer to perform a method for modeling critical-dimension (CD) scanning-electron-microscopy (CD-SEM) extraction during photolithography process model calibration, the method comprising:
receiving a measured CD value which was obtained using a CD-SEM extraction process, wherein the CD-SEM extraction process determines the measured CD value for a feature by measuring multiple CD values of the feature along multiple electron beam scans;
determining a simulated CD value for the feature, wherein the simulated CD value is determined based at least on a set of CD extraction cut-lines which are substantially parallel to each other and are used to compute a single CD value for the feature; and
during photolithography process model calibration, fitting a parameter that models an aspect of a photolithography process based at least on both the measured CD value and the simulated CD value.

9. The non-transitory computer-readable storage medium of claim 8, wherein determining the simulated CD value involves:
placing a measurement window to enclose a target feature;
placing the set of CD extraction cut-lines within the measurement window based at least on a placement spacing parameter, wherein the placement spacing parameter models a spacing between the multiple cut-lines in the CD-SEM extraction process;
extracting a set of single-cut-line CD values for the set of CD extraction cut-lines; and
determining the simulated CD value using the set of single-cut-line CD values.

10. The non-transitory computer-readable storage medium of claim 9, wherein the fitting parameter includes the placement spacing parameter.

11. The non-transitory computer-readable storage medium of claim 9, wherein prior to placing the measurement window, the method further comprises obtaining the simulated pattern by convolving the feature with a photolithography process model.

12. The non-transitory computer-readable storage medium of claim 8, wherein determining the simulated CD value using the set of single-cut-line CD values involves computing an average of the set of single-cut-line CD values.

13. The non-transitory computer-readable storage medium of claim 8, wherein fitting the parameter involves, iteratively:
updating the simulated CD values based at least on an updated photolithography process model; and
updating the parameter's value based at least on a difference between the updated simulated CD value and the measured CD value.

14. The non-transitory computer-readable storage medium of claim 8, wherein fitting the parameter involves minimizing a difference between the simulated CD value and the measured CD value.

15. A method for modeling critical-dimension (CD) scanning-electron-microscopy (CD-SEM) extraction during photolithography process model calibration, the method comprising:
receiving a simulated CD value for a feature, wherein the simulated CD value is extracted from a simulated pattern associated with the feature using a single cut-line placed on the simulated pattern;
receiving raw CD-SEM measurement data for the feature, wherein the raw CD-SEM measurement data comprises multiple measured CD values extracted for the feature using multiple electron beam scans;
using the multiple measured CD values to determine a predicted CD value which predicts the simulated CD value, wherein determining the predicted CD value involves performing a curve fitting on the multiple measured CD values to determine a local minimum or maximum CD value; and
calibrating, by computer, a photolithography process model based at least on both the predicted CD value and the simulated CD value.

16. The method of claim 15, wherein determining the predicted CD value involves determining a CD value along a cut-line on the feature, wherein a location of the cut-line matches a location of the single cut-line used to extract the simulated CD value.

17. A method for modeling critical-dimension (CD) scanning-electron-microscopy (CD-SEM) extraction during post-optical-proximity-correction (post-OPC) verification of a design layout, the method comprising:
- receiving a measured CD value which was obtained using a CD-SEM extraction process, wherein the CD-SEM extraction process determines the measured CD value for a feature by measuring multiple CD values of the feature along multiple electron beam scans;
- determining a simulated CD value for the feature, wherein the simulated CD value is determined based at least on a set of CD extraction cut-lines which are substantially parallel to each other and are used to compute a single CD value for the feature; and
- during post-OPC verification, verifying, by computer, a quality of design layout corrected by OPC by comparing the measured CD value with the simulated CD value.

18. The method of claim 17, wherein determining the simulated CD value involves:
- placing a measurement window to enclose a target feature;
- placing the set of CD extraction cut-lines within the measurement window based at least on a placement spacing parameter, wherein the placement spacing parameter models a spacing between the multiple electron beam scans in the CD-SEM extraction process;
- extracting a set of single-cut-line CD values for the set of CD extraction cut-lines; and
- determining the simulated CD value using the set of single-cut-line CD values.

19. The method of claim 18, wherein prior to placing the measurement window, the method further comprises obtaining the simulated pattern by convolving the feature with the photolithography process model.

20. The method of claim 17, wherein determining the simulated CD value using the set of single-cut-line CD values involves computing an average of the set of single-cut-line CD values.

21. A non-transitory computer-readable storage medium storing instructions that when executed by a computer cause the computer to perform a method for modeling critical-dimension (CD) scanning-electron-microscopy (CD-SEM) extraction during post-optical-proximity-correction (post-OPC) verification of a photolithography process model, the method comprising:
- receiving a measured CD value which were obtained using a CD-SEM extraction process, wherein the CD-SEM extraction process determines the measured CD value for a feature by measuring multiple CD values of the feature along multiple electron beam scans;
- determining a simulated CD value for the feature, wherein the simulated CD value is determined based at least on a set of CD extraction cut-lines which are substantially parallel to each other and are used to compute a single CD value for the feature; and
- during post-OPC verification, verifying a quality of design layout corrected by OPC by comparing the measured CD value with the simulated CD value.

22. The non-transitory computer-readable storage medium of claim 21, wherein determining the simulated CD value involves:
- placing a measurement window to enclose a target feature;
- placing the set of CD extraction cut-lines within the measurement window based at least on a placement spacing parameter, wherein the placement spacing parameter models a spacing between the multiple electron beam scans in the CD-SEM extraction process;
- extracting a set of single-cut-line CD values for the set of CD extraction cut-lines; and
- determining the simulated CD value using the set of single-cut-line CD values.

23. The non-transitory computer-readable storage medium of claim 22, wherein prior to placing the measurement window, the method further comprises obtaining the simulated pattern by convolving the feature with the photolithography process model.

24. The non-transitory computer-readable storage medium of claim 21, wherein determining the simulated CD value using the set of single-cut-line CD values involves computing an average of the set of single-cut-line CD values.

25. A method for modeling critical-dimension (CD) scanning-electron-microscopy (CD-SEM) extraction during post-optical-proximity-correction (post-OPC) verification of a photolithography process model, the method comprising:
- receiving a simulated CD value for a feature, wherein the simulated CD value is extracted from a simulated pattern associated with the feature using a single cut-line placed on the simulated pattern;
- receiving raw CD-SEM measurement data for the feature, wherein the raw CD-SEM measurement data comprises multiple measured CD values extracted for the feature using multiple electron beam scans;
- using the multiple measured CD values to determine a predicted CD value which predicts the simulated CD value, wherein determining the predicted CD value involves performing a curve fitting on the multiple measured CD values to determine a local minimum or maximum CD value; and
- during post-OPC verification, verifying, by computer, a quality of design layout corrected by OPC by comparing the predicted CD value with the simulated CD value.

26. The method of claim 25, wherein determining the predicted CD value involves determining a CD value along a cut-line on the feature, wherein a location of the cut-line matches a location of the single cut-line used to extract the simulated CD value.

* * * * *